United States Patent
Li et al.

(10) Patent No.: US 6,294,027 B1
(45) Date of Patent: Sep. 25, 2001

(54) METHODS AND APPARATUS FOR CLEANING SEMICONDUCTOR SUBSTRATES AFTER POLISHING OF COPPER FILM

(75) Inventors: Xu Li, Santa Clara; Yuexing Zhao, Milpitas; Diane J. Hymes, San Jose; John M. de Larios, Palo Alto, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/227,494

(22) Filed: Jan. 7, 1999

Related U.S. Application Data

(63) Continuation-in-part of application No. 08/955,393, filed on Oct. 21, 1997, now Pat. No. 6,165,956.

(51) Int. Cl.$^7$ ......................................................... B08B 1/00
(52) U.S. Cl. ..................... 134/3; 134/2; 438/691; 510/175; 510/176
(58) Field of Search .................... 510/175, 176; 427/305; 438/633, 5, 691; 216/106; 134/2, 3; 252/79.2, 79.4; 430/517, 271.1, 280.1

(56) References Cited

U.S. PATENT DOCUMENTS

| 5,382,296 |   | 1/1995  | Anttila . |         |
|-----------|---|---------|-----------|---------|
| 5,637,185 | * | 6/1997  | Murarka et al. | 438/5   |
| 5,866,031 | * | 2/1999  | Carpio et al. | 252/79.1 |
| 5,897,375 | * | 4/1999  | Watts et al. | 438/693 |
| 5,954,997 | * | 9/1999  | Kaufman et al. | 252/79.1 |
| 5,965,036 | * | 10/1999 | Maki et al. | 216/108 |
| 5,981,454 | * | 11/1999 | Small | 510/175 |
| 6,001,730 | * | 12/1999 | Farkas et al. | 438/627 |

* cited by examiner

Primary Examiner—Yogendra N. Gupta
Assistant Examiner—Gregory E. Webb
(74) Attorney, Agent, or Firm—Martine & Penilla, LLP

(57) ABSTRACT

A cleaning solution, method, and apparatus for cleaning semiconductor substrates after chemical mechanical polishing of copper films is described. The present invention includes a cleaning solution which combines deionized water, an organic compound, and an ammonium compound in an acidic pH environment for cleaning the surface of a semiconductor substrate after polishing a copper layer. Such methods of cleaning semiconductor substrates after copper CMP alleviate the problems associated with brush loading and surface and subsurface contamination.

16 Claims, 4 Drawing Sheets

METHODS AND APPARATUS FOR CLEANING SEMICONDUCTOR SUBSTRATES AFTER POLISHING OF COPPER FILM

This application is a continuation-in-part of U.S. Patent application Ser. No. 08/955,393, now U.S. Pat. 6,165,956, entitled "Methods and Apparatus for Cleaning Semiconductor Substrates after Polishing of Copper Film", filed Oct. 21, 1997.

BACKGROUND OF THE INVENTION

1. Field of the Invention

This invention relates to methods and apparatus for processing and cleaning a substrate, and more specifically to methods and apparatus for cleaning semiconductor substrates after polishing of copper films.

2. Back Information

In the manufacture of advanced semiconductor devices, copper (Cu) is beginning to replace aluminum (Al) as the material for metallization. Cu has become desirable due to its lower resistivity and significantly improved electromigration lifetime, when compared to Al.

One process for Cu metallization uses a dual damascene approach. As illustrated in FIG. 1a, a dielectric layer 110 is deposited above a substrate 100. Dielectric layer 110 may be made up of materials such as silicon dioxide. Vias and/or trenches 120 are then formed in the dielectric layer 110, as illustrated in FIG. 1b. Vias/trenches 120 may be formed, for example, using dry etching techniques. Next, a thin layer of barrier material (barrier layer) 130, for example, tantalum (Ta), titanium (Ti), or titanium nitride (TiN) is deposited as illustrated in FIG 1c. After barrier layer 130 is deposited the vias/trenches 120 are filled with copper (Cu) layer 140, as illustrated in FIG. 1d. Copper layer 140 may be deposited using well known deposition techniques such as, for example, chemical vapor deposition (CVD), physical vapor deposition (PVD), or electroplating. In order to isolate the copper interconnects, as illustrated in FIG. 1e, the excess copper layer 140 and barrier layer 130 must be removed.

One method for removing the excess copper layer 140 and barrier layer 130 is polishing the surface of the substrate, for example, polishing using chemical mechanical polishing (CMP). In a CMP process, the semiconductor substrate is polished with a slurry containing abrasive particles, such as alumina particles, and an oxidant, such as hydrogen peroxide. In the CMP process, contaminants are introduced which include particles and/or metal contamination on the copper surface 150, dielectric surface 160, and in the dielectric subsurface 165.

Regardless of how the CMP process is performed, the surface of semiconductor substrate must be cleaned of contaminants. If not removed, these contaminants may affect device performance characteristics and may cause device failure to occur at faster rates than usual. Cleaning the semiconductor substrate after chemical mechanical polishing of copper may be necessary to remove such contaminants from the copper layer and dielectric layers.

One method for cleaning the semiconductor substrate after polishing of the copper layer is brush scrubbing. Brush scrubbing, whether single-sided or double-sided brush scrubbing, is the industry standard for cleaning oxide and tungsten CMP applications. However, there are several problems associated with applying brush scrubbing to post copper CMP cleaning.

One such problem is brush loading. During the CMP process, the top surface of the copper layer may be oxidized and forms copper oxide, for example copper oxide ($Cu_2O$ or $CuO$) or copper hydroxide ($Cu(OH)_2$). In basic or neutral pH cleaning environments, the copper oxide or copper hydroxide does not dissolve and may be transferred to the brushes, thus loading the brushes. The contaminated (or loaded) brushes may then transfer the copper oxide or copper hydroxide contaminants to subsequently processed substrates during cleaning.

For tungsten and other oxide applications, brush loading could be curtailed by adding a dilute ammunonium hydroxide ($NH_4OH$). In the presence of $NH_4OH$, part of the copper oxide may form $Cu(NH_3)^{2+}$ complex and may be dissolved; however, due to the high pH environment, the dilute ammonium hydroxide has been found to be insufficient to prevent brush loading of copper oxide. Additionally, it has been found that scrubbing with dilute ammonium hydroxide also causes etching of the copper layer and may cause serious surface roughening.

Brush loading may also occur when alumina particles are used in the copper CMP process. In neutral or inorganic acid (e.g., HCl) cleaning environments, there is an electrostatic attraction between alumina particles and the silicon dioxide surface which makes it difficult to remove the alumina particles from the surface of the dielectric material. Because of the electrostatic attractive force, the alumina particles may also adhere to the brush and cause another brush loading problem with similar effects to those discussed above.

Yet another problem caused by the CMP process is that the surface and subsurface of the dielectric layer may become contaminated during polishing with metal from the copper layer and barrier layer as well as other contaminants from the slurry. During the CMP process, contaminants, especially metal contaminants, may penetrate into the dielectric layer up to approximately 100 angstroms (Å) from the surface. Again, these contaminants may affect device performance characteristics and may cause device failure.

SUMMARY OF THE INVENTION

A cleaning solution, methods and apparatus for cleaning semiconductor substrates after chemical mechanical polishing of copper films is described. In one embodiment, the surface of a semiconductor substrate is cleaned after a copper layer has been polished using a cleaning solution which includes deionized water, an organic compound, and an ammonium compound to create an acidic pH environment.

Additional features and benefits of the present invention will become apparent from the detailed description, figures, and claims set forth below.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1A:
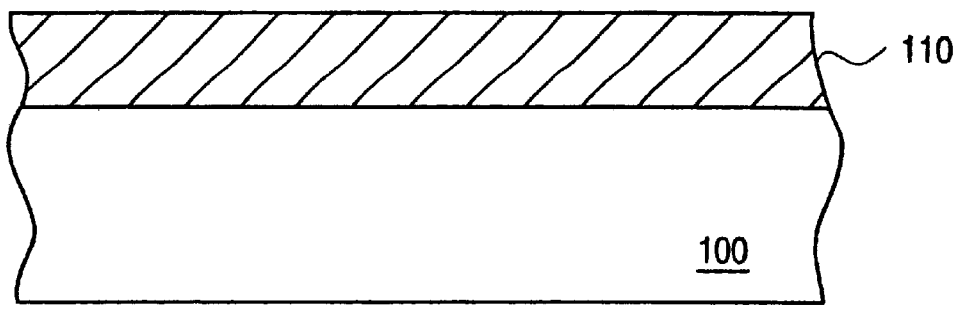
FIG. 1a illustrates a semiconductor substrate having a dielectric layer deposited thereon.
Figure 1B:
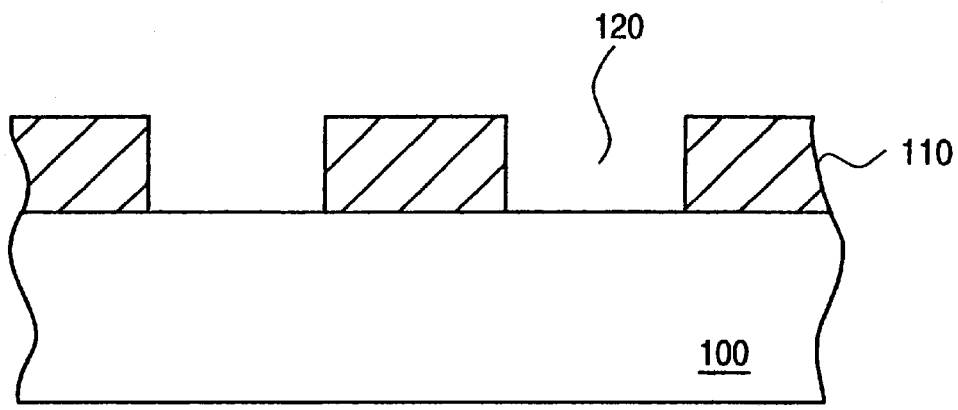
FIG. 1b illustrates the semiconductor substrate of FIG. 1a after vias and/or trenches are formed in the dielectric layer.
Figure 1C:
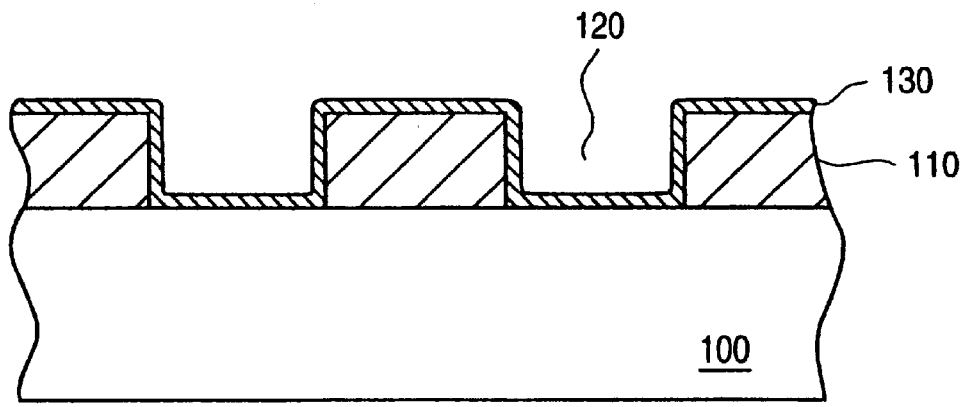
FIG. 1c illustrates the semiconductor substrate of FIG. 1b after a thin barrier layer has been deposited thereon.
Figure 1D:
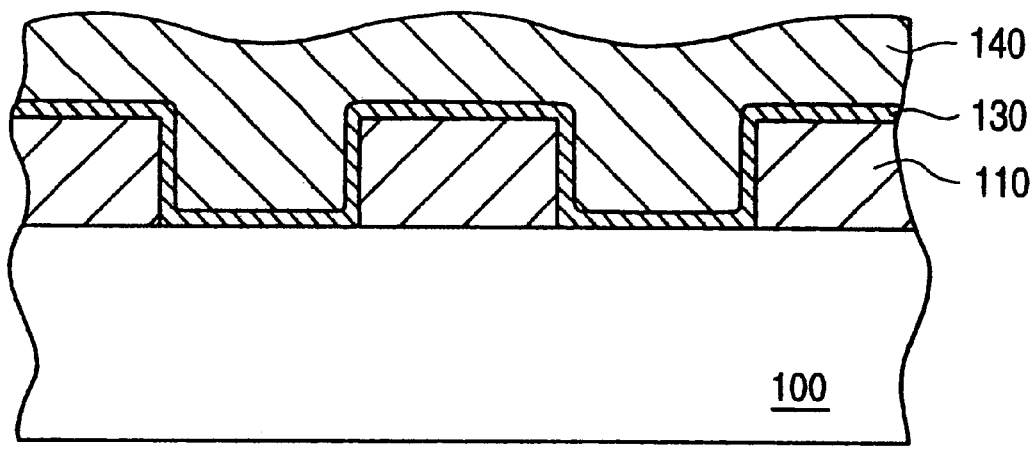
FIG. 1d illustrates the semiconductor substrate of FIG. 1c after a layer of Copper material has been deposited thereon.
Figure 1E:
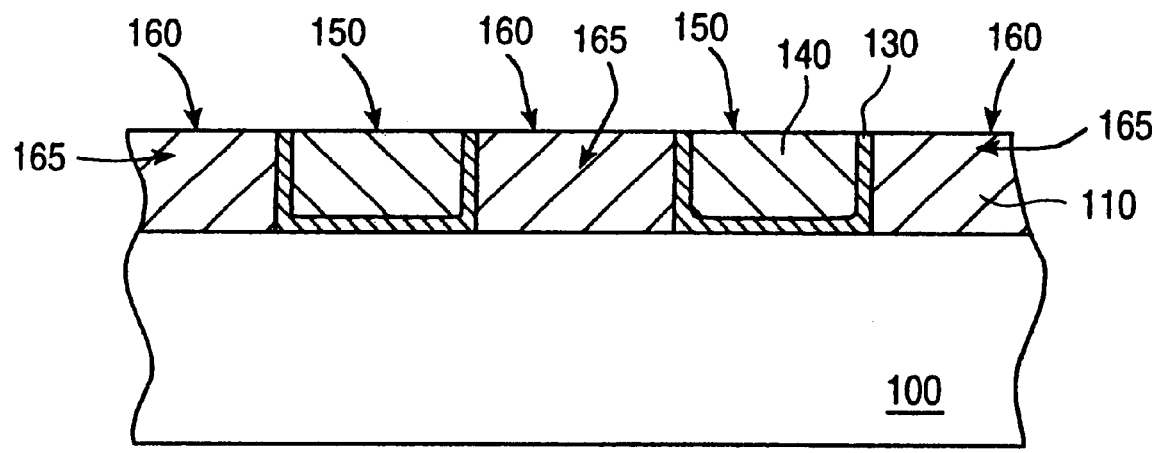
FIG. 1e illustrates the semiconductor substrate of FIG. 1d after chemical mechanical polishing of the excess copper layer and barrier layer.

Methods and apparatuses for cleaning semiconductor substrates after polishing of copper film are disclosed. In the following description, numerous specific details are set forth such as specific materials, processes, parameters, dimensions, etc. in order to provide a thorough understanding of the present invention. It will be apparent, however, to one skilled in the art that these specific details need not be employed to practice the present invention. In other instances, well known materials or methods have not been described in detail in order to avoid obscuring the present invention.

The following description describes cleaning solutions, methods, and apparatus for cleaning a semiconductor substrate. In one embodiment, the cleaning of a semiconductor wafer occurs after the formation of copper interconnect(s) and chemical mechanical polishing (CMP)/planarization of that copper interconnect(s). Processes for formation of copper interconnects in semiconductor device fabrication are well known in the art and are therefore not described in detail herein.

It should also be noted that the term "semiconductor substrate" used herein refers to a silicon semiconductor substrate or a part thereof, such as gallium arsenide, upon which device layers have been or are going to be formed. It should also be noted that the term substrate includes but is not limited to fully processed, semi-processed, or unprocessed substrates with semiconductor materials thereon.

Additionally, although the cleaning solutions, methods and apparatus for cleaning are described in conjunction with the scrubbing of a semiconductor substrate or wafer, it will be appreciated that any similarly shaped, i.e. generally flat substrate, may be processed by the methods and apparatuses of the present invention. Further, it will be appreciated that reference to a semiconductor substrate or wafer may include a bare or pure semiconductor substrate, with or without doping, a semiconductor substrate with epitaxial layers, a semiconductor substrate incorporating one or more device layers at any stage of processing, other types of substrates incorporating one or more semiconductor layers such as substrates having semiconductor on insulator (SIO) devices, or substrates for processing other apparatuses and devices such as flat panel displays, multichip modules, etc.

In one embodiment, a cleaning solution used to clean semiconductors substrates is made up of deionized water, an organic compound, and an inorganic compound, all of which are combined, creating an acidic pH environment for cleaning the surface of a semiconductor substrate. Again, such cleaning may occur after polishing a copper layer. The use of an acidic pH environment helps dissolve copper oxide and alleviates some of the problems of brush loading discussed in the background of the invention. It is advantageous to keep the acidic pH environment within a pH level in the range of approximately 1–6. In one embodiment, the acidic pH environment has a pH level in the range of approximately 2–4.

The use of an organic compound (e.g., an organic acid) helps to form metallic complex compounds, thereby helping removal of the metal contamination from the surface of the dielectric layer and from the surface of the brush. Some examples of organic acids that may be used include: citric acid, malic acid, malonic acid, succinic acid, or any combination of such organic acids.

In one embodiment, the organic compound is dissolved in deionized water (DIW) in a concentration range of approximately 100ppm to 2% by weight. In alternate embodiments, a more preferred concentration range may be approximately 200ppm to 0.1% by weight. In one embodiment, when citric acid is the organic compound, concentration of the citric acid dissolved in deionized water is approximately 0.2% by weight.

The use of an inorganic compound helps to change the electrostatic forces between the particles and surfaces of the brush and substrate in order to make them repulsive. Thus, the particles repel the brushes and the substrate and the substrate and brushes repel the particles, providing favorable conditions for particle removal. In one embodiment, the inorganic compound in the cleaning solution may be ammonium hydroxide ($NH_4OH$), the ammonium salt of an inorganic acid (e.g., ammonium chloride ($NH_4CL$), ammonium fluoride ($NH_4F$)), or an anionic surfactant.

It is desirable to dissolve the inorganic compound in deionized water (DIW) in a concentration range of approximately 100ppm to 2% by weight. In one embodiment, where the inorganic compound is an ammonium compound, the ammonium compound is dissolved in DIW such that the concentration range is approximately 200ppm to 0.1% by weight. In one embodiment, the concentration of ammonium hydroxide (when used in the cleaning solution) when dissolved in DIW is approximately 0.02% by weight.

One example of the many different ways to formulate the cleaning solution is: 0.02% $NH_4OH$, 0.2% Citric Acid by weight mixed in DIW. The pH level of the solution in this example is approximately 4.

If an ammonium salt, such as for example, ammonium chloride or ammonium fluoride, is used, the concentration range of the ammonium salt dissolved in DIW may be approximately 0.05%–0.1% by weight. Also, if an anionic surfactant is used, the concentration range of the anionic surfactant dissolved in DIW may be approximately 50ppm to 0.2% by weight.

In one embodiment, a cleaning solution of DIW, ammonium salt and a chloride compound is used to clean the semiconductor substrates. In one embodiment, the pH level of the solution is in the range of approximately 2–4. The ammonium salt may be one of the ammonium salts discussed above. In one embodiment, it is desirable to dissolve the ammonium salt in deionized water (DIW) in a concentration range of approximately 200ppm to 0.2% by weight. In one embodiment, the ammonium salt is dissolved in the DIW in a concentration of approximately 0.1% by weight. The chloride compound may comprise hydrochloric acid (HCL), ammonium chloride, or a combination of the two. In one embodiment, it is desirable to dissolve the chloride compound in DIW in a concentration range of approximately 0.1% to 1% by weight. In one embodiment, chloride compound is dissolved in DIW in a range of approximately 0.1% by weight.

The cleaning solution may comprise a mixture of chemicals in DIW containing an organic acid, ammonium salt of an inorganic acid, or an anionic surfactant in an acidic pH environment. In such a case, the organic acid may be one of those organic acids listed above, and with a concentration, when dissolved in DIW, of approximately 0.2% by weight or in a concentration range of 0.1% to 1% by weight. In the case of using an anionic surfactant, it is desirable to dissolve the anionic surfactant in DIW in a concentration range of approximately 50ppm to 0.2% by weight and approximately 0.2% by weight in one embodiment.

In one embodiment, the chemicals of the present invention are premixed in the same cleaning solution to simultaneously solve several problems related to post copper CMP cleaning using a brush scrubber. Cross contamination from substrate to substrate and within the same substrate are therefore reduced substantially, or even prevented in this simple approach. Hydrochloric acid (HCl) may also be added to the solution to adjust pH and help dissolve copper oxide.

The present invention covers various formulations of the cleaning solution, and each component in the solution may be replaced by different chemical that has similar properties. As described in the background of the invention, after the copper interconnects on a semiconductor substrate have been planarized using CMP techniques, it is necessary to clean the semiconductor substrate and remove any contaminants from the surface and subsurface of the semiconductor substrate. One such technique for removing contaminants from the semiconductor substrate is scrubbing the semiconductor substrate (substrate).

As an example, and not by limitation, the present invention is described in conjunction with a scrubbing process, more specifically, a scrubbing process in which both sides of the wafer are scrubbed simultaneously. The scrubber may include a number of stations. Each of these stations represents one or more steps in the substrate cleaning process. Contaminated substrates are loaded at one end of the system and cleaned and dried substrates are unloaded from the other end of the system. Examples of systems of this type are the DSS-200™ Scrubber and the Synergy™ Scrubber available from Lam Research Corporation (formerly OnTrak Systems, Inc.) of Fremont, Calif.

Figure 2:
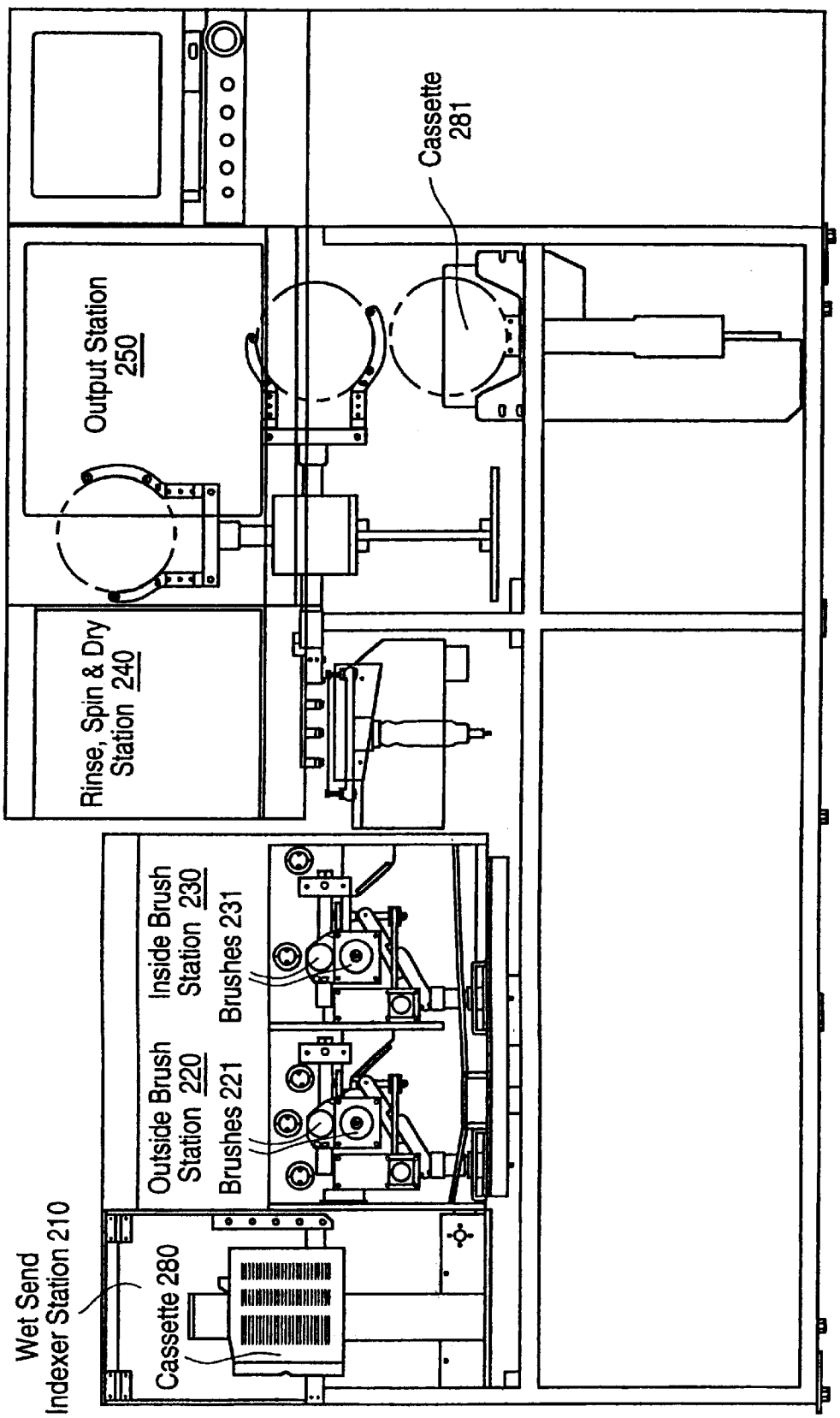
FIG. 2 illustrates one embodiment of a scrubber system.

FIG. 2 represents a cross sectional view of a Synergy™ configuration (cleaning system) Usually, the contaminated substrates are delivered to the cleaning system after chemical mechanical planarization (CMP) from a wet bench or from other processes resulting in contamination. At the start of the cleaning process, contaminated substrates are loaded into a wafer cassette 280 (cassette) and the cassette 280 is then placed into the wet send indexer station 210. After cassette 280 is placed into wet send indexer station 210, the substrates are automatically removed from the cassette 280 and placed, one at a time, into the outside brush station 220.

In the outside brush station 220, a substrate is processed through a first scrub. During the first scrub, the cleaning solution may be applied to the substrate in several different ways. For example, in one embodiment the cleaning solution is sprayed onto the substrate. In another embodiment the cleaning solution is applied to the substrate through brushes 221. Yet another embodiment applies the cleaning solution by dripping the cleaning solution onto the substrate.

The scrubbed substrate is then automatically removed from the outside brush station 220 and placed into the inside brush station 230. In the inside brush station 230, the substrate is processed through a second scrub. In the inside brush station 230 the cleaning solution may be applied to the substrate in a similar manner as in outside brush station 220.

After the second scrub the substrate is then automatically removed from the inside brush station 230 and placed into the rinse, spin and dry station 240. Rinse, spin, and dry station 240 rinses, spins, and dries the substrate. At this point the wafer has been cleaned.

Once the rinse, spin, and dry steps have been completed the substrate is then transported from the rinse, spin, and dry station 240 to the output station 250 where the substrate will be placed into cassette 281. The transfer is usually carried out by a robotic arm which lifts the substrate out of the rinse, spin, and dry station 240 by its edges and places it into the cassette 281. The cassette is then transferred to storage or to another cleaning or processing system.

It will be apparent to one of ordinary skill in the art that some of the steps in the cleaning system described above may occur in another order and/or with various solutions depending upon the substrate or substrate layer being cleaned. For example, different cleaning solutions, such as water, citric acid, ammonium hydroxide, anunonium citrate, and hydrofluoric acid solution (or mixtures of solutions) may be used in one of the brush stations. Also, other systems may include one brush station, or more than two brush stations. Moreover, other systems may omit one or more of the above stations/steps and may include additional processing stations, such as a CMP station.

While the previous description illustrates a cleaning system in which both sides of the substrate are scrubbed simultaneously, the techniques described herein may be used in other cleaning systems and processes. For example, a cleaning system in which only a single side of the substrate is scrubbed or a cleaning system in which the substrate is cleaned with chemical spray.

Figure 3:
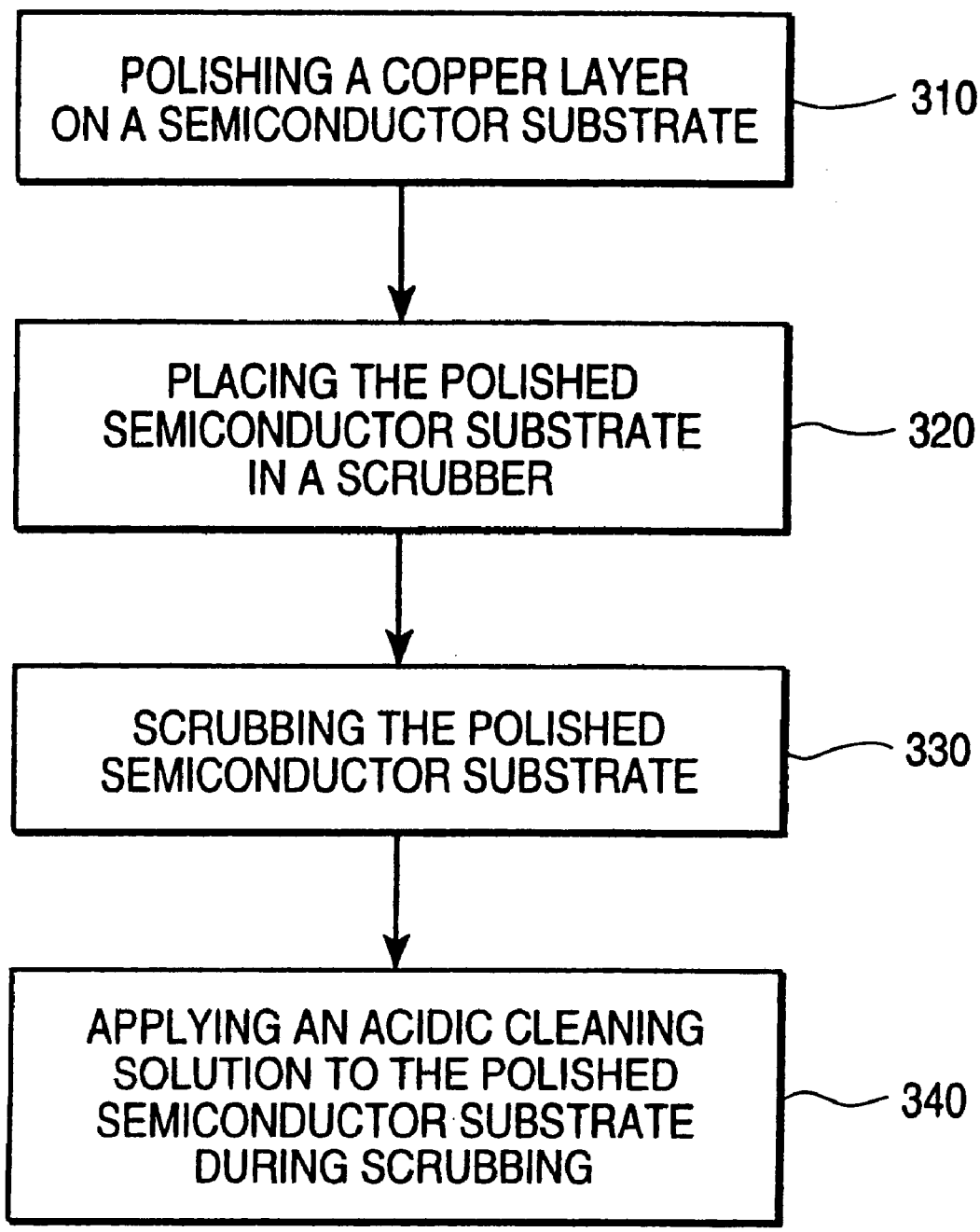
FIG. 3 illustrates a flowchart of one embodiment of the process of the present invention.

FIG. 3 illustrates one embodiment of a cleaning process. At step 310, the copper layer is planarized using chemical mechanical polishing. It should be noted that other techniques for planarization of the copper layer may be used and that it may still be desirable to clean the semiconductor substrate using the present invention after such planarization in order to remove potential contaminants from the substrate surface and/or subsurface.

At step 320, the polished semiconductor substrate is then placed in a scrubber. The substrate is then scrubbed, at step 330, to remove the contaminants caused by the polishing process. During scrubbing, a cleaning solution, such as described above, is applied to the substrate in order to aid and/or effectuate the removal of the contaminants (step 340). This cleaning solution may be used in either outside brush station 220 or inside brush station 230, or both brush stations if necessary, of the scrubber in FIG. 2.

Thus, embodiments of the present invention, which may include cleaning environment and methods for cleaning substrates, such as, for instance, post copper CMP substrates, alleviate the problems of brush loading without affecting the quality of the copper and dielectric layers. Furthermore, these embodiments, when used to clean post copper CMP substrates have the capability of removing surface and subsurface contaminants from the copper and dielectric layers.

Hence, methods and apparatus for cleaning semiconductor substrates after polishing of copper film have been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method to remove contaminants from a semiconductor substrate, comprising:

placing a semiconductor substrate that has been subjected to a chemical mechanical polishing operation in a scrubbing apparatus, the semiconductor substrate having a polished copper layer; and scrubbing the semiconductor substrate in an acidic cleaning solution comprising deionized water, an ammonium salt of an inorganic acid, and a chloride compound selected from the group consisting of hydrogen chloride ammonium chloride, and mixtures thereof.

2. The method defined in claim 1 wherein the acidic cleaning solution is a buffered acidic pH environment.

3. The method defined in claim 1 wherein the acidic cleaning solution has a pH level in the range of approximately 2-4.

4. The method defined in claim 1 wherein the ammonium salt of the inorganic acid is dissolved in the deionized water at a concentration range of approximately 200 ppm to 0.2% by weight.

5. The method defined in claim 1 wherein the chloride compound is dissolved in the deionized water at a concentration range of approximately 0.1% to 1.0% by weight.

6. The method defined in claim 1 wherein the ammonium salt of the inorganic acid is dissolved in the deionized water at a concentration range of approximately 0.05% to 0.1% by weight.

7. A scrubber for processing a semiconductor substrate, comprising:

an input to receive a semiconductor substrate, a brush assembly coupled to the input; and a cleaning solution delivery system for delivering a cleaning solution comprising deionized water, an ammonium salt of an inorganic acid, and a chloride compound, wherein said cleaning solution delivery system delivers the cleaning solution premixed to create an acidic pH environment to the semiconductor substrate having the polished copper layer.

8. The scrubber defined in claim 7 wherein the cleaning solution has a pH level in the range of approximately 2–4.

9. The scrubber defined in claim 7 wherein the ammonium salt of the inorganic acid is dissolved in the deionized water at a concentration range of approximately 200 ppm to 0.2% by weight.

10. The scrubber defined in claim 7 wherein the chloride compound is selected from the group consisting of hydrogen chloride and ammonium chloride, and is dissolved in the deionized water at a concentration range of approximately 0.1% to 1.0% by weight.

11. A scrubber for processing a semiconductor substrates comprising:

an input to receive a semiconductor substrate having a polished copper layer;

a brush assembly coupled to the input; and a cleaning solution delivery system for delivering a cleaning solution comprising deionized water, an anionic surfactant, and an organic compound, wherein said cleaning solution delivery system delivers the cleaning solution premixed to create an acidic pH environment to the semiconductor substrate having the polished copper layer.

12. The scrubber defined in claim 11 wherein the organic compound is selected from the group consisting of citric acid, malic acid, malonic acid, succinic acid, and mixtures thereof.

13. The scrubber defined in claim 12 wherein the organic compound is dissolved in the deionized water at a concentration range of approximately 100 ppm to 2% by weight.

14. The scrubber defined in claim 13 wherein the organic compound is citric acid, and the citric acid is dissolved in the deionized water at a concentration of approximately 0.2% by weight.

15. The scrubber defined in claim 5 wherein the anionic surfactant is dissolved in deionized water at a concentration range of approximately 50 ppm to 0.2% by weight.

16. The scrubber defined in claim 14 wherein the cleaning solution has a pH of approximately 4.

* * * * *